(12) United States Patent
Adusumilli et al.

(10) Patent No.: US 11,316,064 B2
(45) Date of Patent: Apr. 26, 2022

(54) PHOTODIODE AND/OR PIN DIODE STRUCTURES

(71) Applicant: GLOBALFOUNDRIES U.S. INC., Santa Clara, CA (US)

(72) Inventors: Siva P. Adusumilli, South Burlington, VT (US); John J. Ellis-Monaghan, Grand Isle, VT (US); Mark D. Levy, Williston, VT (US); Vibhor Jain, Williston, VT (US); Andre Sturm, Essex Junction, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 16/887,375

(22) Filed: May 29, 2020

(65) Prior Publication Data
US 2021/0376180 A1    Dec. 2, 2021

(51) Int. Cl.
| | |
|---|---|
| *H01L 31/107* | (2006.01) |
| *H01L 31/105* | (2006.01) |
| *H01L 31/036* | (2006.01) |
| *H01L 31/028* | (2006.01) |
| *H01L 31/0312* | (2006.01) |

(52) U.S. Cl.
CPC .......... *H01L 31/107* (2013.01); *H01L 31/028* (2013.01); *H01L 31/036* (2013.01); *H01L 31/03125* (2013.01); *H01L 31/105* (2013.01)

(58) Field of Classification Search
CPC ............... H01L 31/0264; H01L 31/028; H01L 31/0288; H01L 31/0304–03125; H01L 31/0352; H01L 31/035281; H01L 31/03529; H01L 31/036; H01L 31/08; H01L 31/10–119; H01L 31/18; H01L 31/1804–1824; H01L 31/184–1856
See application file for complete search history.

(56) References Cited

U.S. PATENT DOCUMENTS

| | | |
|---|---|---|
| 2,557,110 A | 6/1951 | Jaynes |
| 2,619,538 A | 11/1952 | Grant |
| (Continued) | | |

FOREIGN PATENT DOCUMENTS

KR     20100070601 A  *  6/2010

OTHER PUBLICATIONS

Office Action in U.S. Appl. No. 16/844,606 dated Jul. 1, 2021, 12 pages.

(Continued)

*Primary Examiner* — Andres Munoz
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to photodiodes and/or PIN diode structures and methods of manufacture. The structure includes: at least one fin including substrate material, the at least one fin including sidewalls and a top surface; a trench on opposing sides of the at least one fin; a first semiconductor material lining the sidewalls and the top surface of the at least one fin, and a bottom surface of the trench; a photosensitive semiconductor material on the first semiconductor material and at least partially filling the trench; and a third semiconductor material on the photosensitive semiconductor material.

19 Claims, 5 Drawing Sheets

(56) References Cited

U.S. PATENT DOCUMENTS

| | | | |
|---|---|---|---|
| 3,787,871 | A | 1/1974 | Reese |
| 4,481,523 | A | 11/1984 | Osaka |
| 4,799,031 | A | 1/1989 | Lang et al. |
| 6,147,349 | A | 11/2000 | Ray |
| 6,180,945 | B1 | 1/2001 | Barton et al. |
| 7,002,429 | B2 | 2/2006 | Asao et al. |
| 7,361,526 | B2 | 4/2008 | Maa et al. |
| 7,397,101 | B1 | 7/2008 | Masini et al. |
| 7,777,250 | B2 | 8/2010 | Lochtefeld |
| 7,790,495 | B2 | 9/2010 | Assefa et al. |
| 7,795,064 | B2 | 9/2010 | Pan et al. |
| 7,902,540 | B2 * | 3/2011 | Cohen .................. B82Y 10/00 257/9 |
| 9,064,699 | B2 | 6/2015 | Wang et al. |
| 9,864,138 | B2 | 1/2018 | Coolbaugh et al. |
| 10,157,947 | B2 | 12/2018 | Chen et al. |
| 10,359,569 | B2 | 7/2019 | Dumais |
| 10,600,839 | B2 | 3/2020 | Kurokawa |
| 2003/0030814 | A1 | 2/2003 | Osinski et al. |
| 2007/0099315 | A1 | 5/2007 | Maa et al. |
| 2008/0070355 | A1 | 3/2008 | Lochtefeld et al. |
| 2011/0037133 | A1 | 2/2011 | Su et al. |
| 2012/0213468 | A1 | 8/2012 | Lipson et al. |
| 2014/0159183 | A1 | 6/2014 | Na |
| 2014/0185979 | A1 | 7/2014 | Evans et al. |
| 2014/0217269 | A1 | 8/2014 | Guo et al. |
| 2015/0075599 | A1 * | 3/2015 | Yu .................. H01L 31/03529 136/256 |
| 2015/0097256 | A1 | 4/2015 | Ang et al. |
| 2015/0115333 | A1 | 4/2015 | Bobde et al. |
| 2016/0155884 | A1 | 6/2016 | Hon et al. |
| 2018/0204761 | A1 | 7/2018 | Feilchenfeld et al. |
| 2020/0020734 | A1 | 1/2020 | Wang et al. |

OTHER PUBLICATIONS

Yu, "High-Efficiency p-i-n Photodetectors on Selective-Area-Grown Ge for Monolithic Integration", IEEE Electron Device Letters, vol. 30, Issue 11, Nov. 2009, 4 pages/.

Knoll, "High-Performance BiCMOS Si Photonics Platform", IEEE, 2015, 9 pages.

Liao et al., "36 GHz submicron silicon waveguide germanium photodetector", Optics Express, vol. 19, Issue 11, May 20, 2011, 6 pages.

Huang et al., "Germanium on Silicon Avalanche Photodiode", IEEE Journal of Selected Topics in Quantum Electronics, vol. 24, No. 2, Mar./Apr. 2018, 11 pages.

Jutzi et al., "Ge-on-Si Vertical Incidence Photodiodes With 39-GHz Bandwidth", IEEE Photonics Technology Letters, vol. 17, Issue 7, Jul. 2005, 3 pages.

Koester et al., "Germanium-on-Insulator Photodetectors", IEEE, Oct. 2005, 3 pages.

Notice of Allowance in U.S. Appl. No. 16/531,819 dated Apr. 28, 2021, 9 pages.

Final Office Action in U.S. Appl. No. 16/844,606 dated Oct. 29, 2021, 9 pages.

Response to Final Office Action in U.S. Appl. No. 16/844,606 dated Nov. 23, 2021, 9 pages.

Second Response to Final Office Action in U.S. Appl. No. 16/844,606 dated Jan. 5, 2022, 9 pages.

* cited by examiner

PHOTODIODE AND/OR PIN DIODE STRUCTURES

FIELD OF THE INVENTION

The present disclosure relates to semiconductor structures and, more particularly, to photodiodes and/or PIN diode structures and methods of manufacture.

BACKGROUND

An avalanche photodiode (APD) is a highly sensitive semiconductor photodiode that exploits the photoelectric effect to convert light into electricity. From a functional standpoint, the avalanche photodiode can be regarded as the semiconductor analog of photomultipliers. Typical applications for avalanche photodiodes are long-range fiber-optic telecommunication and quantum sensing for control algorithms. Newer applications include positron emission tomography and particle physics.

Avalanche photodiode applicability and usefulness depends on many parameters. Two factors, for example, are quantum efficiency and total leakage. Quantum efficiency indicates how well incident optical photons are absorbed and then used to generate primary charge carriers; whereas, total leakage current is the sum of the dark current, photocurrent and noise.

Photodiode sensitivity is dependent on the length of the path of light through the photosensitive material and the ability of generated carrier pairs to reach the electrode/contact/cathode. In conventional structures, the carriers travel in a two dimensional pathway, e.g., vertically or laterally, which results in a long pathway. Due to the longer pathways of conventional avalanche photodiodes, there is a high frequency of photon recombination within the photosensitive material resulting in signal loss or weakening of the signal, itself. Moreover, the photosensitive material itself needs to be very thick, which is expensive and time consuming to grow, and which can make integration with other circuit elements more challenging.

SUMMARY

In an aspect of the disclosure, a structure comprises: at least one fin comprising substrate material, the at least one fin including sidewalls and a top surface; a trench on opposing sides of the at least one fin; a first semiconductor material lining the sidewalls and the top surface of the at least one fin, and a bottom surface of the trench; a photosensitive semiconductor material on the first semiconductor material and at least partially filling the trench; and a third semiconductor material on the photosensitive semiconductor material.

In an aspect of the disclosure, a structure comprises: at least one fin of single crystalline semiconductor material; at least one trench on opposing sides of the at least one fin, the trench having a bottom surface of the single crystalline semiconductor material; a semiconductor material having a first dopant type which lines sidewalls and a top surface of the at least one fin and the bottom surface of the at least one trench; a photosensitive semiconductor material over the semiconductor material and partially filling the at least one trench; and a second semiconductor material having the first dopant type and which fills a remaining portion of the at least one trench and contacting the photosensitive semiconductor material over the at least one fin.

2

In an aspect of the disclosure, a method comprises: forming at least one fin comprising substrate material; forming a trench on opposing sides of the at least one fin; forming a first semiconductor material lining the at least one fin, and a bottom surface of the trench; forming a photosensitive semiconductor material on the first semiconductor material and at least partially filling the trench; and forming a third semiconductor material on the photosensitive semiconductor material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to photodiodes and/or PIN diode structures and methods of manufacture. More specifically, the present disclosure relates to photodiodes and/or pin diode structures with multiple vertical and horizontal surfaces (composed from fins). Advantageously, the present disclosure provides a decrease time for growth of photodiode material (e.g., Ge) by providing an increased semiconductor seed surface area, while also allowing a thinner photodiode material (e.g., Ge) region needed to absorb light. In addition, the structures described herein provide a shorter path from a carrier generation site to the collection site, thereby increasing the efficiency of the photodiode.

In embodiments, the present disclosure comprises a photodiode composed of photodetector material, e.g., Ge, formed on fins of substrate material. The fins can be formed into concentrically nested shapes (e.g., circles, rectangles, squares, octagons, etc.) or a spiral shaped capture area, amongst other shapes. As will be described herein, the larger surface area of the fins will facilitate the growth of the photodetector material, e.g., Ge. Also, the Si fins within the Ge detector region will provide for improved efficiency by increasing a surface capture area. The spiral shaped capture area may have a larger surface area compared to the concentrically nested shapes (e.g., circles, rectangles, squares, octagons, etc.), for example. Accordingly, the spiral shaped photodiode can provide improved efficiency by increasing the surface area compared to the concentric circle configuration.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures use three basic building blocks: (i) deposition of thin films of material on a substrate, (ii) applying a patterned mask on top of the films by photolithographic imaging, and (iii) etching the films selectively to the mask.

Figure 1:
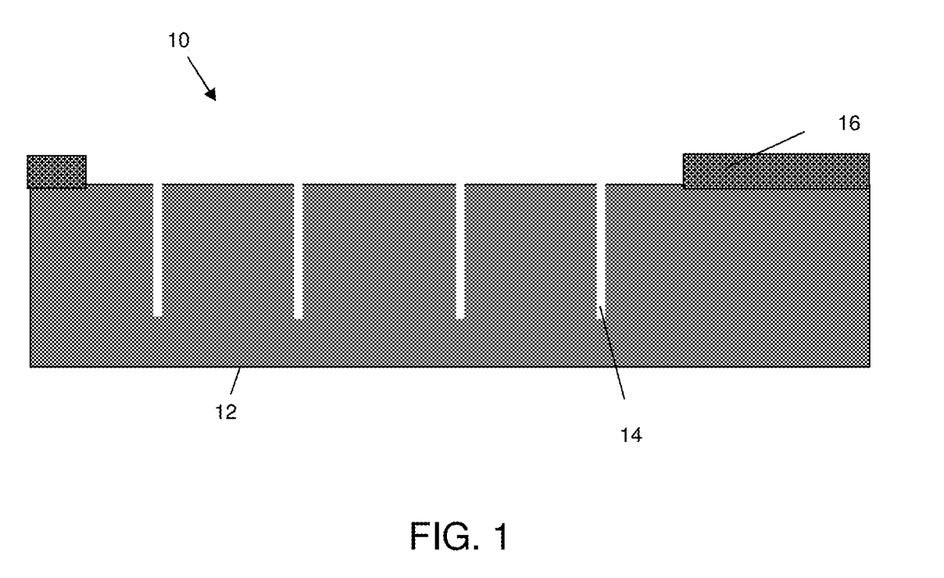
FIG. 1 shows a substrate with trenches, amongst other features, and respective fabrication processes in accordance with aspects of the present disclosure.

FIG. 1 shows a substrate, amongst other features, and respective fabrication processes in accordance with aspects of the present disclosure. More specifically, the structure 10 includes a substrate 12. The substrate 12 can be representative of a CMOS chip, for example. In embodiments, the substrate 12 is preferably single crystalline Si material; although other semiconductor materials are contemplated herein. For example, the substrate 12 can be composed of any suitable material including SiC, GaAs, InAs, InP, and other III/V or II/VI compound semiconductors. In preferred embodiments, the substrate 12 is a N-type substrate composed of a single semiconducting material such as bulk silicon.

One or more trenches 14 are formed in the substrate 12 using conventional lithography and etching processes known to those of skill in the art. In one non-limiting example, the trenches 14 can have a depth of about 2.5 µm (although other dimensions are contemplated herein). In embodiments, the trenches 14 can be a single trench that is formed in a spiral pattern, or multiple trenches formed in concentric circles or other nested shapes (e.g., concentrically nested shapes of circles, rectangles, squares, octagons, etc.). As described in FIG. 6, for example, the trenches 14 can be optional.

In forming the one or more trenches 14, a resist formed over the substrate 12 is exposed to energy (light) to form a pattern (opening). An etching process with a selective chemistry, e.g., reactive ion etching (RIE), will be used to form one or more trenches 14 in the substrate 12. A HF clean can follow the etching process to remove contaminants from the surfaces of the trenches 14, thereby ensuring a clean surface of exposed semiconductor material of the bottom surface and sidewalls of the trenches 14. The resist can be removed by a conventional oxygen ashing process or other known stripants.

Still referring to FIG. 1, a hardmask 16 is deposited on the substrate 12. In embodiments, the hardmask 16 can be nitride or other hardmask material as is known in the art such that no further explanation is required for a complete understanding of the present disclosure. The hardmask 16 can be deposited by known deposition methods such as, e.g., chemical vapor deposition (CVD) process. In embodiments, the hardmask 16 is patterned to expose the trenches 14 and portions of the substrate 12 surrounding the trenches. In this way, the hardmask 16 will prevent epitaxial growth of semiconductor material on portions of the substrate 12 in subsequent processes.

Figure 2:
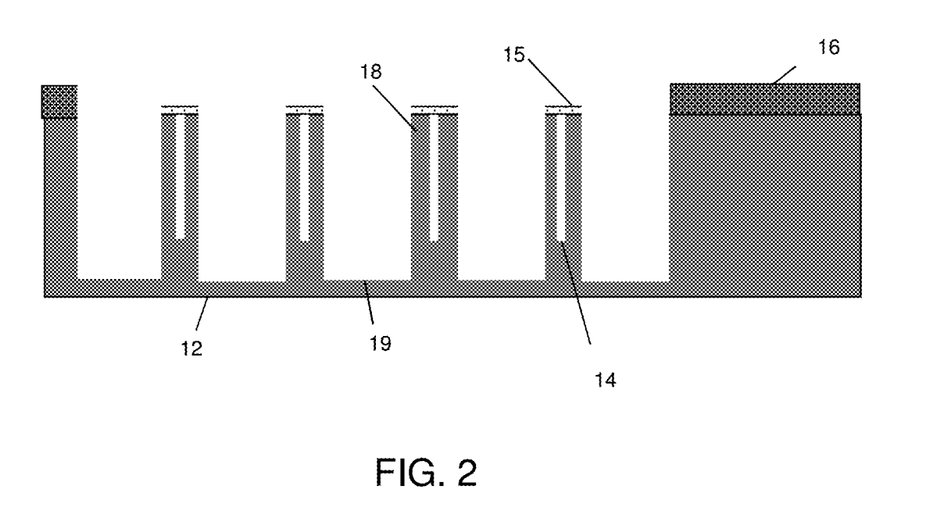
FIG. 2 shows one or more fins formed from the substrate, amongst other features, and respective fabrication processes in accordance with aspects of the present disclosure.

In FIG. 2, one or more fins 18 are formed in the substrate 12. In embodiments, the fins 18 can also be a combination of substrate material and dielectric material (e.g., oxide). In the latter implementation, prior to forming of the fins 18, an optional dielectric material can be deposited on a top surface of the substrate, as represented by reference numeral 15.

In embodiments, multiple fins 18 can be formed into multiple concentric shapes (e.g., concentrically nested circles, rectangles, squares, octagons, etc.) or a single fin can be formed in a spiral shaped capture area, amongst other shapes. The fins 18 are aligned with the trenches 14 such that each fin 18 is associated with a trench 14 along its midline (e.g., length). In embodiments, the trench 14 of each fin 18 will act as an isolation feature, which can be used to isolate light within a photodiode cell.

The fins 18 can be formed by conventional etching processes, including a sidewall imaging technique (SIT). In the SIT technique, for example, a mandrel is formed on exposed substrate 12, using conventional deposition, lithography and etching processes. For example, a mandrel material, e.g., $SiO_2$, is deposited on the substrate 12 using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the narrow fin structures 18. Spacers are formed on the sidewalls of the mandrels which are preferably material that is different than the mandrels, and which are formed using conventional deposition processes known to those of skill in the art. The spacers can have a width which matches the dimensions of the fin structures 18, for example. The mandrels are removed or stripped using a conventional etching process, selective to the mandrel material. An etching is then performed within the spacing of the spacers to form the sub-lithographic features, e.g., fins 18 with spaces or trenches 19 therebetween. In embodiments, the trenches 19 can be any shape including, but not limited to bars, squares or ovals. The sidewall spacers can then be stripped.

Figure 3A:
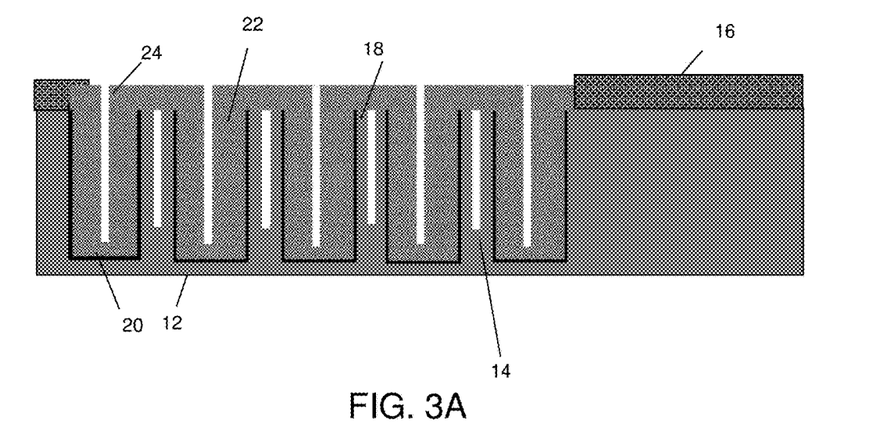
FIG. 3A shows a cross-sectional view of photodiode material filling spaces between the fins, amongst other features, and respective fabrication processes in accordance with aspects of the present disclosure.

FIG. 3A shows a side cross-sectional view of the trenches 19 between the fins 18 filled with photodiode material, e.g., Ge based material 22 with an optional liner 20. As shown representatively in FIG. 3A, the liner 20 is grown on exposed surfaces of the substrate 12, e.g., sidewalls and top surface of the fins 18. As should be understood by those of ordinary skill in the art, the hardmask 16 will prevent growth of semiconductor material on a surface of the substrate 12 outside of the fins 18 and adjacent trenches 19. In embodiments, the liner 20 can be an epitaxial grown semiconductor material, e.g., a P-type semiconductor material, preferably composed of the same material as the substrate 12, e.g., Si.

As further shown in FIG. 3A, an additional semiconductor material 22 is selectively grown on the semiconductor material 20. In embodiments, the semiconductor material 22 is an intrinsic photosensitive semiconductor material (non-doped) epitaxially grown on the liner 20, e.g., over the substrate 12 and surfaces of the fins 18. The semiconductor material 22 is preferably Ge material which offers superior responsivity. In alternative embodiments, the semiconductor material 22 can be Si, SiGe, etc. The semiconductor material 22 is preferably thicker than the liner 20.

In embodiments, the liner 20 and the additional semiconductor material 22 will effectively seal the trench 14, resulting in an isolation feature composed of air. In alternative embodiments, dielectric material can be deposited within the trenches 14, prior to the deposition of the liner 20 and the additional semiconductor material 22. The dielectric material will effectively result in dielectric filled fin structures.

In preferred implementations, the epitaxial growth of the semiconductor material 22 will not result in a pinch-off phenomenon, thereby leaving an opening or trench 24 within the semiconductor material 22, adjacent to the fins 18. In alternative embodiments, the opening or trench 24 can be formed by lithography and etching processes as is known in the art such that further explanation is not required for a complete understanding of the present disclosure.

Figure 3B:
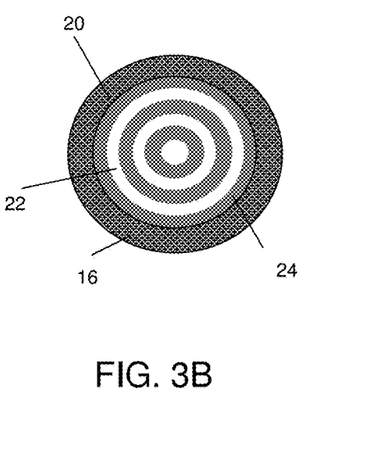
FIGS. 3B-3D show top views of different configurations of the fins with the photodiode material, amongst other features, and respective fabrication processes in accordance with aspects of the present disclosure.
Figure 3C:
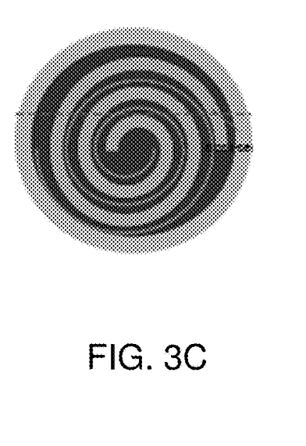
Figure 3D:
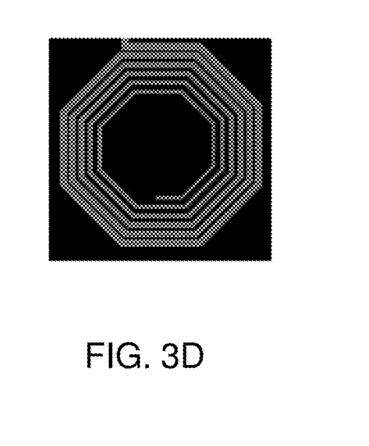

FIGS. 3B-3D show top views of different configurations of the structure of FIG. 3A. For example, FIG. 3B shows a circular pattern (requiring several fin structures 18); whereas, FIG. 3C shows a spiral pattern (requiring a single spiral fin structure 18). FIG. 3D shows a spiral octagonal pattern (requiring a single spiral fin structure 18). It should be understood that other shapes are also contemplated herein such as nested rectangles, nested squares, etc. In embodiments, the spiral shape may have a larger surface area compared to the concentric circle shape, for example. And, as should be understood by those of skill in the art, the fins 18 will provide an increased semiconductor seed surface area for the growth of the photodiode material (e.g., Ge). This results in a decrease time for growth of the photodiode material (e.g., Ge), in addition to allowing a thinner photodiode material (e.g., Ge) region needed to absorb light. Moreover, the use of the fins 18 provides a shorter path from a carrier generation site (e.g., Ge material 22) to the collection site (e.g., substrate 12 or liner 20), thereby increasing the efficiency of the photodiode. The spiral shaped photodiode also provides improved efficiency by increasing the surface area compared to the concentric circles.

Figure 4:
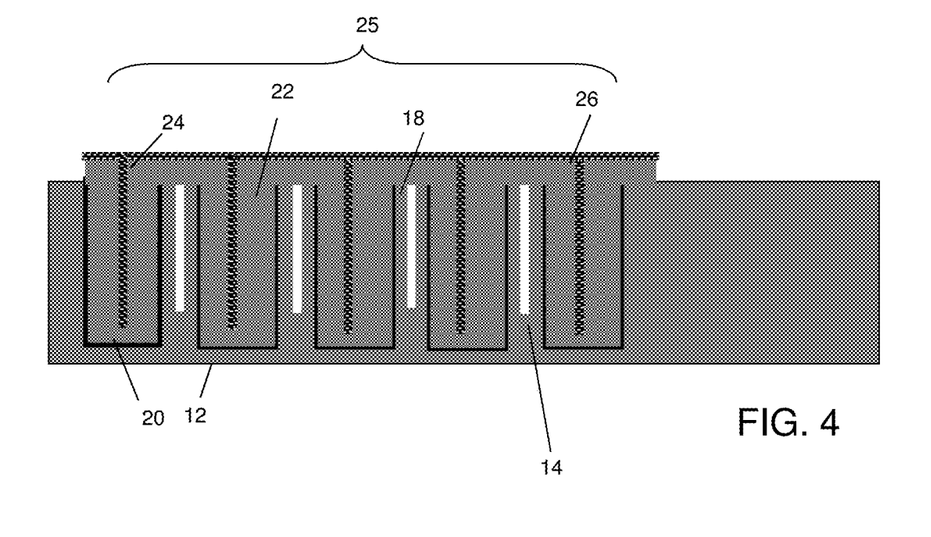
FIG. 4 shows a photodiode in accordance with additional aspects of the present disclosure.

In FIG. 4, a semiconductor material 26 is epitaxially grown in the opening 24 directly on the photodiode material (e.g., Ge) 22. In embodiments, the semiconductor material 26 will also grow on the upper, exposed surface of the photodiode material (e.g., Ge) 22. The semiconductor material 26 is preferably the same material as the liner 20. For example, the semiconductor material 26 is a P+ type semiconductor material or polysilicon. In FIG. 4, the hardmask 16 is removed by a selective etching process, after the growth of the semiconductor material 26.

In embodiments, the semiconductor material 26 is a P+ plug to provide biasing for operation of an avalanche photodiode 25. In this way, a N-P-I-P photodiode 25 can be formed. More specifically, the P+ material, e.g., semiconductor material 26 and the P+ material (e.g., liner 20) on the sides and bottom of the Ge material (e.g., semiconductor material 22) create an avalanche photodiode 25 which is biased in three dimensions, increasing the likelihood of picking up a signal before carrier recombination.

Figure 5:
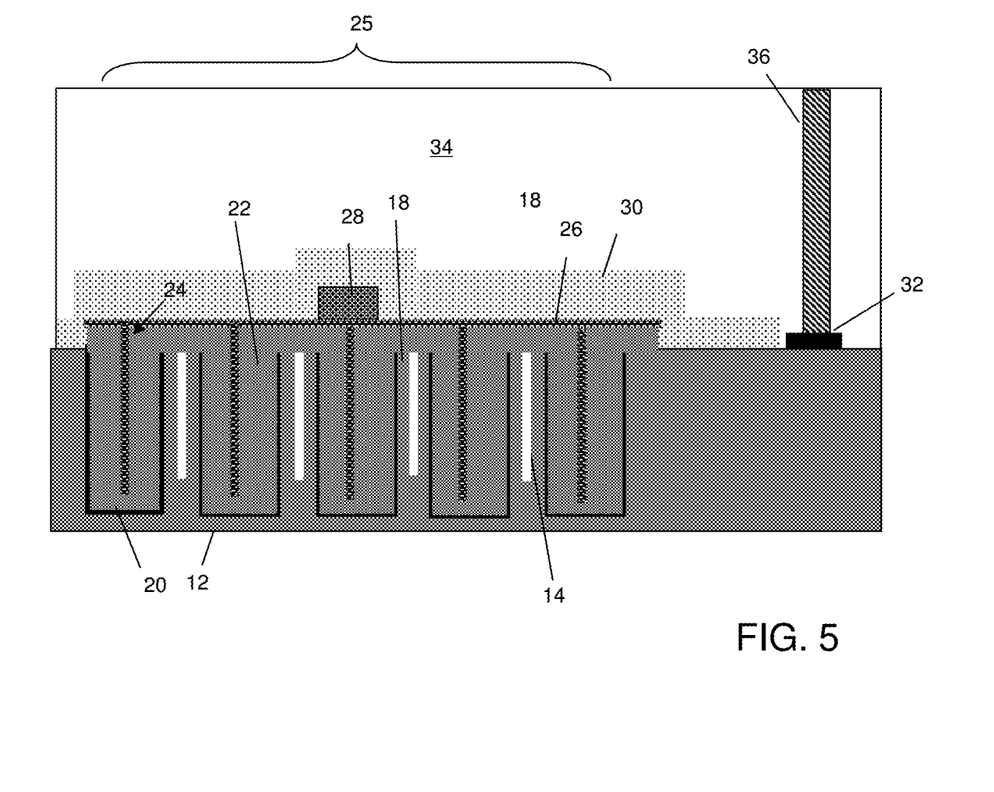
FIG. 5 shows contact formation to the photodiode, amongst other features, and respective fabrication processes in accordance with aspects of the present disclosure.

FIG. 5 shows contact formation to the photodiode 25, amongst other features, and respective fabrication processes. In FIG. 5, a semiconductor material 28, e.g., polysilicon, is formed on the top side of the photodiode 25 and, more specifically, in contact with the semiconductor material 26. The semiconductor material 28 will act as a contact to the top of the semiconductor material 26 (e.g., P+ plug of the photodiode 25). More specifically, the semiconductor material 28 will bring in a driving current to the photodiode 25 to bias the plug, e.g., semiconductor material 26, and drive carriers from the center of the photodiode 25 (e.g., semiconductor material 22) towards the outside of the photodiode 25, (e.g., liner of semiconductor material 20). In this way, the drive current will effectively amplify the signal.

A film 30, e.g., nitride or other hardmask material, will cover or isolate the semiconductor material 28 to prevent silicide forming on the top of the photodiode 25. The film 30 can be deposited by conventional deposition processes, e.g., CVD, followed by a patterning process to expose a portion of the substrate 12 on a side of the photodiode 25. The unsilicided top surface will provide optimal performance under front-side illumination of the photodiode 25.

A silicide contact 32 is formed on an exposed surface of the substrate 12, on a side of the photodiode 25. As should be understood by those of skill in the art, the silicide process begins with deposition and patterning of a thin transition metal layer, e.g., nickel, cobalt or titanium, over the semiconductor material of the substrate 12. After deposition and patterning of the material, the structure is heated allowing the transition metal to react with exposed silicon (or other semiconductor material as described herein) forming a low-resistance transition metal silicide. Following the reaction, any remaining transition metal is removed by chemical etching, leaving the silicide contacts 32.

Still referring to FIG. 5, an interlevel dielectric material (e.g., oxide) 34 is deposited over the structure. A trench is formed in the interlevel dielectric material (e.g., oxide) 34, aligned with and exposing a top surface of silicide contact 32. The trench is formed by conventional lithography and etching processes as already described herein. The trench is filled with a metal material, e.g., tungsten, to form a contact 36. As should be understood by those of skill in the art, the contact 36 is used to detect the current generated by the photons hitting the photodiode 25.

Figure 6:
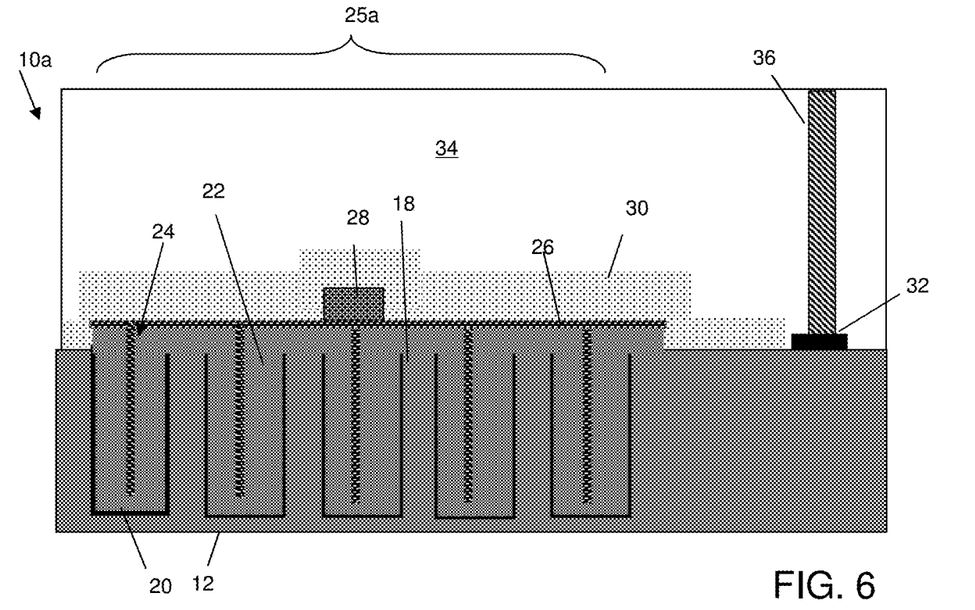
FIG. 6 shows a photodiode in accordance with additional aspects of the present disclosure.

FIG. 6 shows a photodiode 25a in accordance with additional aspects of the disclosure. More specifically, in the structure 10a of FIG. 6, a photodiode 25a is provided without the trenches 14, e.g., isolation features, associated with the fins 18. In this way, each fin 18 is composed of only semiconductor material. The remaining structures and methods of fabrication of the photodiode 25a of FIG. 6 are similar to that described with respect to FIGS. 2-5.

Figure 7:
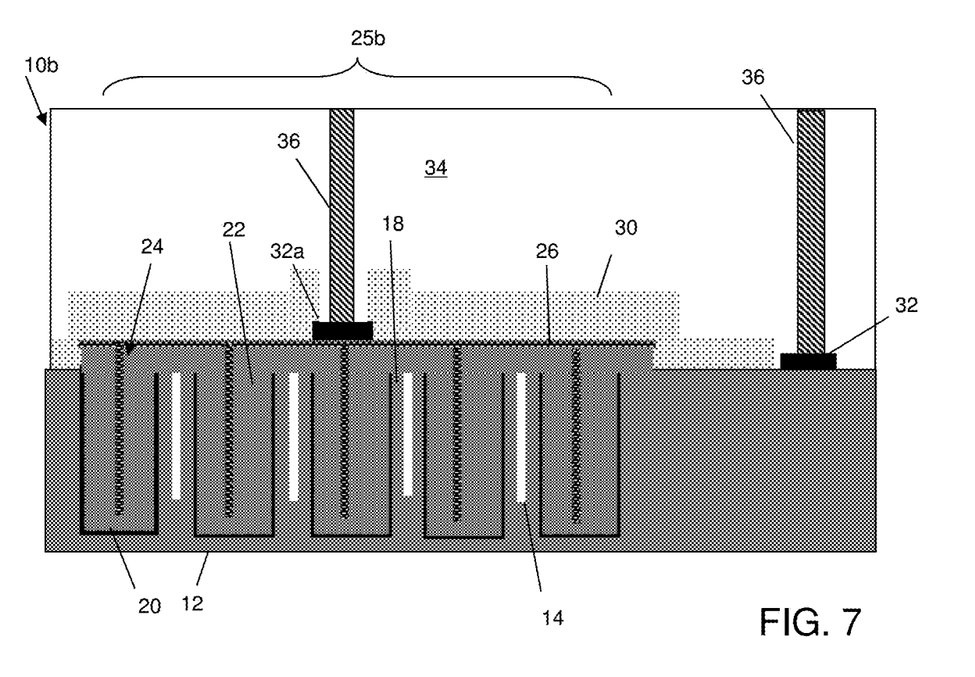
FIG. 7 shows a photodiode in accordance with yet additional aspects of the present disclosure.

FIG. 7 shows a photodiode 25b in accordance with additional aspects of the disclosure. More specifically, in the structure 10b of FIG. 7, the photodiode 25b includes a silicide contact 32a formed directly on a top surface of the photodiode 25b, e.g., on the semiconductor material 26. This arrangement is suitable for backside illumination. Thereafter, a contact 36 is formed to the silicide contacts 32a, 32 as described with reference to FIG. 5. It should also be understood that the use of the trench 14 is also optional.

Figure 8:
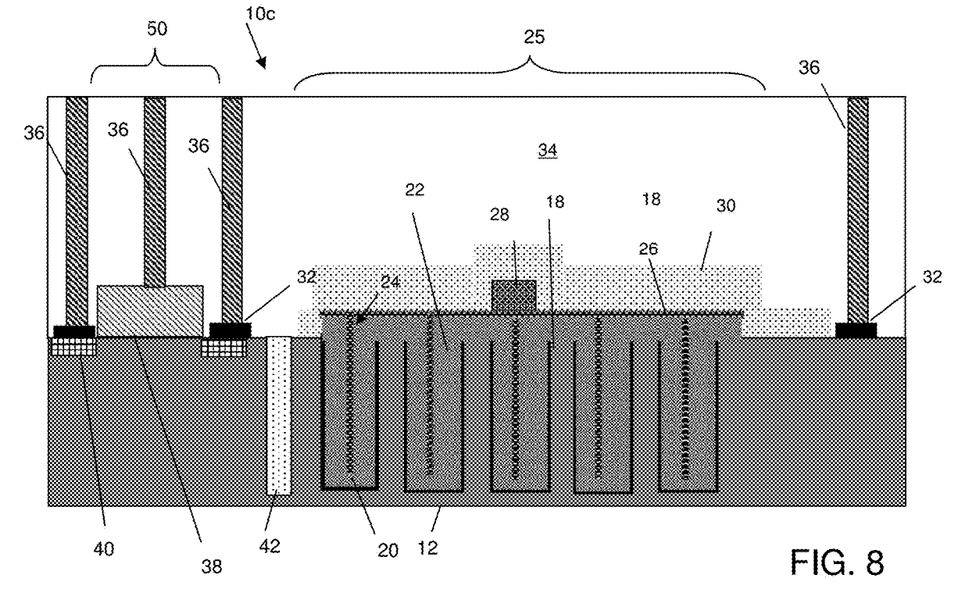
FIG. 8 shows a photodiode integrated with a CMOS structure on a single chip in accordance with aspects of the present disclosure.

FIG. 8 shows a structure 10c comprising the photodiode 25 and CMOS structure 50 integrated into a single chip. In this embodiment, the photodiode 25 is similar to that which is described in FIG. 5; although any of the photodiodes described herein can be used with the CMOS structure 50. The CMOS structure 50 is separated from the photodiode 25 by a shallow trench isolation region 42, fabricated using known lithography, etching and deposition processes such that no further explanation is required for a complete understanding herein.

In this implementation, the CMOS structure 50 includes a gate structure 38 with source and drain regions 40. In embodiments, the source and drain regions 40 can be raised epitaxial regions, or doped (e.g., dopant or ion implanted) regions. The silicide contacts 32 and contacts 36 are provided in contact with the source and drain regions 40. In a metal gate implementation, the contact 36 is directly in contact with the gate structure 38. Moreover, the CMOS structure 50 can be fabricated directly on the bulk wafer or on semiconductor on insulator (SOI) technology.

Figure 9:
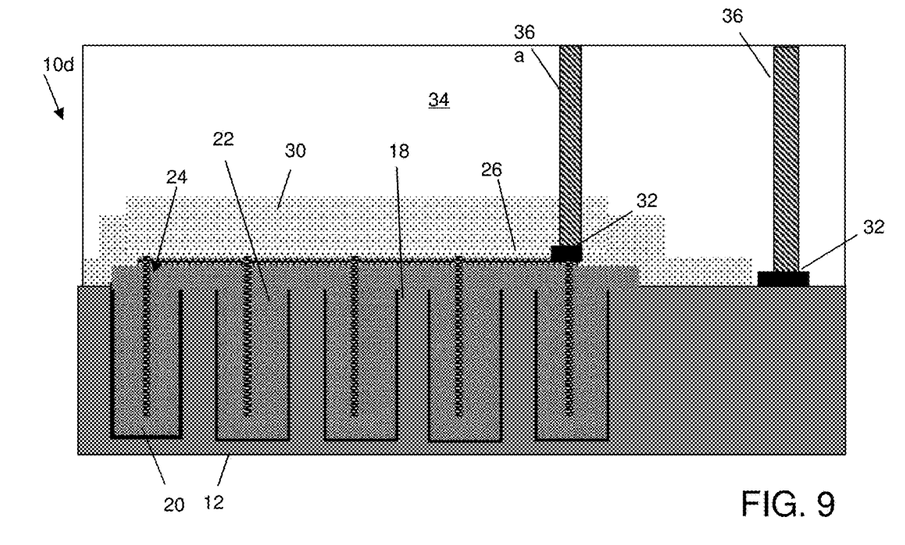
FIG. 9 shows a PIN diode in accordance with aspects of the present disclosure.

FIG. 9 shows a PIN diode in accordance with aspects of the present disclosure. In this structure 10d, the fins 18 are doped in an alternating pattern to provide a short P-I-N photodiode path length. For example, the fins 18 can be doped by ion implantation that introduces a concentration of a dopant in the fin 18, e.g., prior to or after fin formation. The alternating fins 18 may be doped by introducing a concentration of a different dopant of opposite conductivity type in the fin, while protecting the other alternating fins with an implantation mask. Each of the implantation masks has a thickness and stopping power sufficient to block masked areas against receiving a dose of the implanted ions. For example, the implantation mask may include a layer of a light-sensitive material, such as an organic photoresist, applied by a spin coating process, pre-baked, exposed to light projected through a photomask, baked after exposure, and developed with a chemical developer. Alternating fins can be doped with p-type dopants, e.g., Boron (B), and n-type dopants, e.g., Arsenic (As), Phosphorus (P) and Sb, among other suitable examples.

The structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   at least one fin comprising substrate material, the at least one fin including sidewalls and a top surface;
   a trench on opposing sides of the at least one fin;
   a first semiconductor material lining the sidewalls and the top surface of the at least one fin, and a bottom surface of the trench;
   a photosensitive semiconductor material on the first semiconductor material and at least partially filling the trench;
   a third semiconductor material on the photosensitive semiconductor material; and
   an isolation structure composed of air or dielectric material within the at least one fin.

2. The structure of claim 1, wherein the substrate material comprises single crystalline semiconductor material and the at least one fin is provided in a spiral configuration.

3. The structure of claim 1, wherein the substrate material comprises single crystalline semiconductor material and the at least one fin comprises multiple fins in a concentrically nested shape, each of which are surrounded by multiple trenches.

4. The structure of claim 3, wherein the multiple fins are alternatively doped of different dopant types.

5. The structure of claim 1, further comprising a transistor separated from the at least one fin by an isolation structure.

6. The structure of claim 1, wherein the photosensitive semiconductor material comprises intrinsic semiconductor material.

7. The structure of claim 6, wherein the intrinsic semiconductor material comprises undoped Ge material.

8. The structure of claim 6, wherein the substrate material comprises N-type semiconductor material, and the first semiconductor material and the third semiconductor material comprise P-type semiconductor material.

9. The structure of claim 6, wherein the third semiconductor material is within a trench and on a top surface of the photosensitive semiconductor material, above the at least one fin, to bias operation of an avalanche photodiode.

10. The structure of claim 6, further comprising an unsilicided semiconductor material on the third semiconductor material, a masking material over the unsilicided semiconductor material, and a contact electrically contacting to the substrate material.

11. The structure of claim 6, further comprising a silicided semiconductor material on the third semiconductor material, a first contact contacting the silicided semiconductor material, and a second contact electrically contacting to the substrate material.

12. A structure, comprising:
    at least one fin of single crystalline semiconductor material;
    at least one trench on opposing sides of the at least one fin, the at least one trench having a bottom surface composed of the single crystalline semiconductor material;
    a semiconductor material having a first dopant type which lines sidewalls and a top surface of the at least one fin and the bottom surface of the at least one trench;
    a photosensitive semiconductor material over the semiconductor material and partially filling the at least one trench;
    a second semiconductor material having the first dopant type and which fills a remaining portion of the at least one trench and contacting the photosensitive semiconductor material over the at least one fin; and
    an isolation structure composed of air or dielectric material within the at least one fin.

13. The structure of claim 12, wherein the single crystalline semiconductor material comprises N-type material and the first dopant type comprises P-type material, and the photosensitive semiconductor is an undoped material, different than the single crystalline semiconductor material.

14. The structure of claim 12, further comprising a silicide contact on the second semiconductor material.

15. The structure of claim 12, further comprising an unsilicided semiconductor material on the second semiconductor material.

16. The structure of claim 12, wherein the photosensitive semiconductor material comprises undoped Ge material.

17. The structure of claim 12, wherein the least one fin of single crystalline semiconductor material is multiple fins in a nested configuration.

18. The structure of claim 12, wherein the least one fin of single crystalline semiconductor material is in a spiral configuration.

19. A method comprising:
   forming at least one fin comprising substrate material with an isolation structure composed of air or dielectric material within the at least one fin;
   forming a trench on opposing sides of the at least one fin;
   forming a first semiconductor material lining the at least one fin, and a bottom surface of the trench;
   forming a photosensitive semiconductor material on the first semiconductor material and at least partially filling the trench; and
   forming a third semiconductor material on the photosensitive semiconductor material.

* * * * *